United States Patent [19]

Sato

[11] Patent Number: 4,526,802
[45] Date of Patent: Jul. 2, 1985

[54] FILM DEPOSITION EQUIPMENT

[75] Inventor: Kazuo Sato, Tokyo

[73] Assignee: Clarion Co., Ltd., Tokyo, Japan

[21] Appl. No.: 481,004

[22] Filed: Mar. 31, 1983

[51] Int. Cl.³ .............................................. C23C 13/00
[52] U.S. Cl. .......................................... 427/8; 427/39;
427/255.3; 118/726; 118/692; 118/667;
204/192 N
[58] Field of Search ............... 118/692, 726, 663, 667;
427/255.3, 8, 39, 255.1, 255.2; 204/192 N

[56] References Cited

U.S. PATENT DOCUMENTS 4,287,224  9/1981  Heimbach et al. .................... 427/42

Primary Examiner—John D. Smith
Assistant Examiner—Bernard F. Plantz
Attorney, Agent, or Firm—Flynn, Thiel, Boutell & Tanis

[57] ABSTRACT

This film deposition equipment is arranged so that metal is evaporated in atmosphere including reactive gas introduced in a vacuum, and pressure variation of the reactive gas caused by the metal evaporation is detected to know and control metal evaporation amount.

1 Claim, 3 Drawing Figures

FILM DEPOSITION EQUIPMENT

BACKGROUND OF THE INVENTION

This invention relates to a film deposition equipment ensuring deposition of film with constant composition.

In the fields of electricity and chemistry, various conductive or insulative films are used. Particularly in the electronic field it is desired to obtain films with constant quality for use in electronic devices.

Reactive high frequency (RF) ion plating is known as one of the film deposition methods that is effective to satisfy the abovementioned requirement. FIG. 1 shows equipment to be used for said reactive RF ion plating. Reference numeral 1 designates a vacuum chamber, 2 refers to a substrate holder, 3 to a substrate to be provided with a film thereon, 4 to an evaporation source metal, 5 to an evaporating power source, 6 to an RF power source, 7 to a matching circuit, 8 to an acceleration DC power source, 9 to an RF discharge electrode, 10 to a reactive gas inlet, 11 to a reactive gas outlet, 12 to a valve, 13 to a crystal oscillator, 14 to a film thickness monitor, 15 to an evaporating speed monitor, and 16 to a controller.

With this equipment, glow discharge is caused by the RF discharge electrode 9 within the vacuum chamber 1. The metal 4 is evaporated in the atmosphere including reactive gas introduced through the reactive gas inlet 10. Thereby, the reactive gas and the metal components react and the resulting compound forms a film on the substrate 3. In this case, since plasma is generated due to glow discharge, the reactive gas and the metal particles become radicals or are ionized so as to be chemically active. Therefore, it is possible to make a film with excellent crystallization on a substrate at a considerably low temperature as compared to other vacuum evaporating deposition methods.

If ions are accelerated and bombard the substrate 3 by applying DC voltage between the evaporation source metal 4 and the substrate 3 by means of the acceleration DC power source 8 (minus V at the substrate 3 and 0 to several kV at the metal 4), chemical activity is further improved. Further, since the reactive RF ion plating uses RF electric field, glow discharge is maintained even when pressure in the vacuum chamber 1 is very low ($\sim 5 \times 10^{-5}$ TORR). As the result, a fine, even and planar film can be provided. Further, since the increase of temperature of the surface of the substrate 3 due to striking or radiation energy of ions is not so large, it is easy to control the temperature of the substrate 3.

To ensure and maintain evenness of film quality, constant conditions must be maintained throughout the entire process of film deposition.

Particularly when film is made by chemical reaction between more than two kinds of elements such as said reactive gas and the metal, it is important to precisely control the amounts of the respective elements in order to maintain the stoichiometric chemical composition of the film.

Substrate temperature, RF power, acceleration voltage, gas pressure and metal evaporating speed are parameters for deposition of desired film. However, it is most important to reliably control the metal evaporating speed.

To this end, there is used a crystal oscillation monitoring method as shown in FIG. 1 in which the crystal oscillator 13 is disposed within the vacuum chamber 1 to detect the metal evaporating speed. More specifically, since the crystal oscillator 13 has such a nature that its resonance frequency varies in proportion to the amount of film deposited thereon, the metal evaporating speed is controlled by the following manner: the thickness of the film deposited on the crystal oscillator 13 is measured by the film thickness monitor 14; the resulting output signal from the monitor 14 is differentiated by the speed monitor 15 to detect variation of resonance frequency i.e. vapor deposition speed; and in response to the detection result, an output signal to maintain constant vapor deposition speed is fed back to the evaporating power source.

However, the crystal oscillation monitoring method has the following drawbacks:

(1) when the temperature of the crystal oscillator 13 increases due to radiation heat from the evaporation source (metal) and plasma, variation of resonance frequency becomes irregular, causing measurement error;

(2) there is an upper limitation to the thickness of the film which the crystal oscillator 13 can detect;

(3) since films adhere on the RF discharge electrode 9 and along the inner periphery of the vacuum chamber 1 during film deposition for a long time, matching of the EF power becomes disordered little by little whereby to change the discharge condition, and noise is caused by the change and appears at the film thickness monitor 14;

(4) since the noise appearing at the film thickness monitor 14 is promoted by differentiation by the speed monitor 15, it becomes larger;

(5) since it takes a relatively long time from detection of resonance frequency variation to feedback to evaporation speed control, the evaporation speed cannot be immediately controlled.

Therefore, it is difficult to provide, by the prior art method, a film with even and constant quality.

OBJECT OF THE INVENTION

It is therefore an object of the present invention to maintain a constant evaporation speed of metal in order to make a film with even thickness and quality.

SUMMARY OF THE INVENTION

In accordance with the present invention, variation of reaction gas pressure caused by evaporation of metal is detected by use of stoichiometric correlation between the reactive gas and the metal upon gettering action, and the metal evaporating amount is controlled in response to the detection result.

DETAILED DESCRIPTION OF THE PREFERRED EMBODIMENT

The phenomenon that, when metal with strong activity is evaporated within a vacuum chamber wherein a reactive gas is present, the remaining reactive gas is taken up by the evaporated metal to increase the vacuum degree, is well known as the gettering action. Details of the gettering action are complicated. However, it is generally considered that since evaporated metal, i.e., metal vapor, reacts with the remaining gas in the gas phase to take up the gas and the metal component continues to take up the remaining gas even after it is deposited on the inner surface of the vacuum chamber, the pressure of the remaining gas descreases, thereby improving the vacuum degree. Further, it is considered that when plasma is generated due to discharge, this tendency is further promoted and the gettering action becomes remarkable. Therefore, the gettering action might become particularly remarkable in reactive RF ion plating.

If it is assumed that the flow amount of reactive gas introduced into the vacuum chamber is fixed constant, the gas pressure is kept constant. This gas pressure is expressed by $P_1$. When the metal is thereafter evaporated within the vacuum, the gas pressure decreases. The decreased gas pressure is designated by $P_2$. The decrease expressed by $P_1 - P_2 = \Delta P$ depends on the metal evaporating speed and RF power.

Since film deposition is carried out under the gas pressure $P_2$, the pressure $P_2$ must be stabilized. That is, it is desired to stabilize the pressure decrease $\Delta P$. One of the two parameters, RF power, can be relatively easily controlled. However, it is difficult to reliably control the other parameter i.e. metal evaporating speed.

The fact that the reactive gas and the metal react on each other with a determined stoichiometric correlation upon gettering action, however, makes it possible to reliably control gas pressure variation $\Delta P$.

Figure 1:
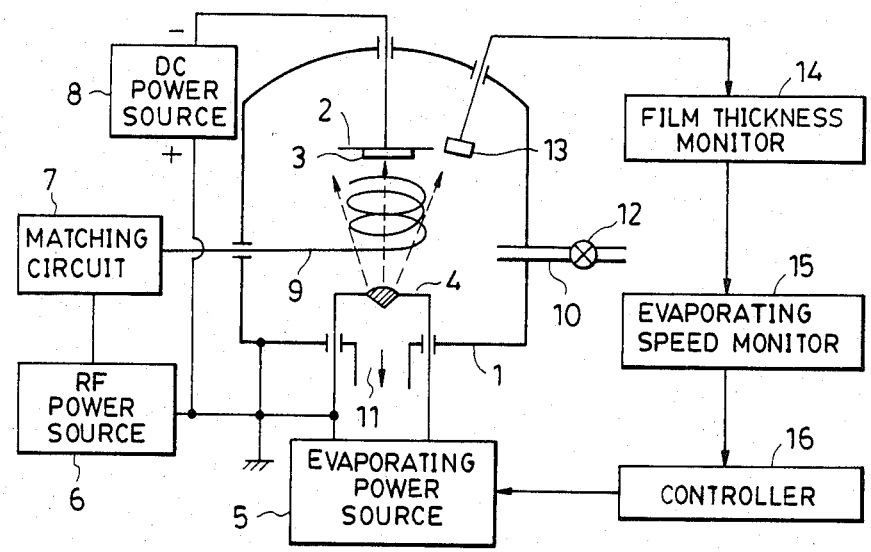
FIG. 1 is schematic view of a conventional equipment.
Figure 2:
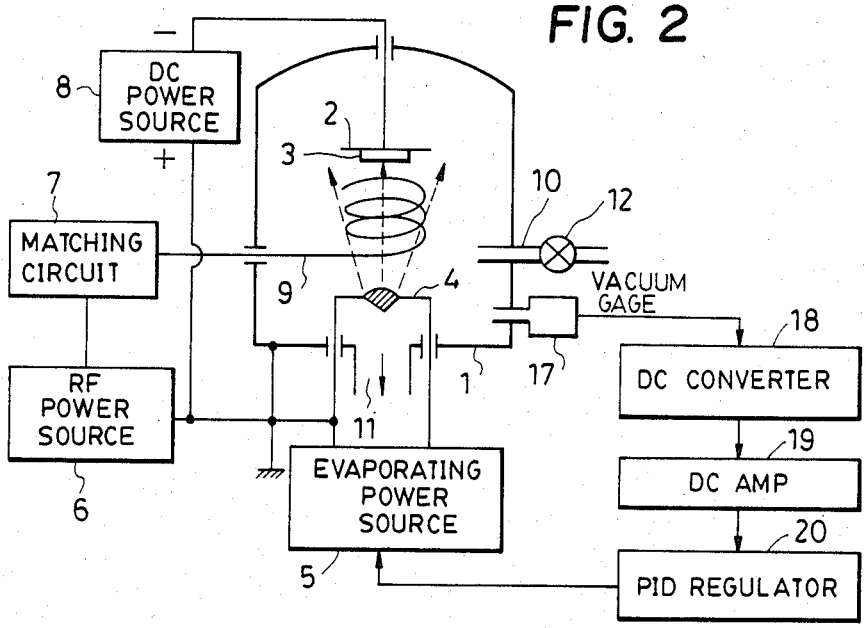
FIG. 2 is a schematic view of an embodiment of the equipment according to the present invention.

FIG. 2 shows a schematic view of the reactive RF plating equipment which is an embodiment of the film deposition equipment according to this invention. In this Figure, elements and parts corresponding those of FIG. 1 are designated by the same reference numerals. Reference numeral 17 refers to a vacuum gauge, 18 to a DC converter, 19 to a DC amplifier, and 20 to a PID regulator.

With this arrangement, after air in the vacuum chamber 1 is discharged to lower the pressure to about $1 \times 10^{-6}$ TORR, reactive gas i.e. oxygen gas, for example, is introduced through the reactive gas inlet 10 so as to maintain gas pressure of $8 \times 10^{-4}$ TORR, approximately.

Next, glow discharge is caused within the vacuum 1 due to RF electric field. After the discharge and the said gas pressure reach predetermined values, evaporation source metal 4, i.e., zinc, for example, is heated and evaporated by the evaporating power source 5.

Along with metal evaporation, gas pressure within the vacuum chamber 1 decreases (vacuum degree increases) due to the gettering action, thereby representing certain value in response to metal evaporating speed.

The value of gas pressure is detected by the vacuum gauge 17 and the detection output is converted to DC voltage by the DC converter 18. The DC voltage is amplified by the DC amplifier 19 and is applied to the PID regulator 20. The PID regulator compares the DC voltage to a reference voltage value which is previously set in response to the determined gas pressure, and applies output equal to the reference voltage value to the evaporating power source 5.

The evaporating power source 5 accordingly controls the metal evaporating amount to select an evaporation speed corresponding to the DC voltage of the value equal to the value of the reference setting value. Therefore, by detecting the variation of gas pressure, the metal evaporating speed is controlled to be stable.

Oxygen which is the reactive gas and zinc which is the evaporation source metal 4 react to form zinc oxide and ZnO film is deposited on the substrate 3.

The ZnO film is even and constant in its composition. When the evaporating speed changes, the change $\Delta P$ is immediately detected and evaporating speed is controlled until the variation $\Delta P$ is stabilized.

Figure 3:
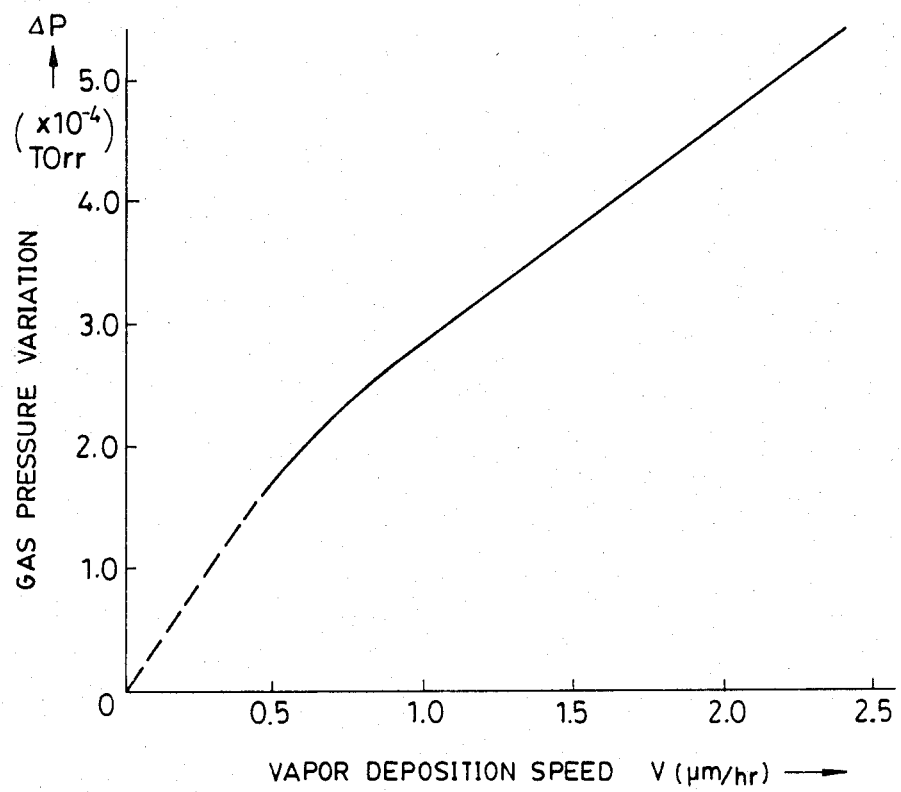
FIG. 3 shows the relation between gas pressure variation and vapor deposition speed obtained by the present invention.

FIG. 3 shows the relationship between the evaporation speed V, abscissa, and gas pressure variation $\Delta P$, ordinate, which is obtained by the present invention. As is apparent from the Figure, both factors are substantially correlated so that the metal vapor deposition speed V can be controlled by adjusting the gas pressure variation $\Delta P$. It should be noted that this characteristic is obtained under the conditions: material of the substrate 3: (III)-oriented silicon; substrate temperature: ordinary room temperature; ZnO film thickness: 4 $\mu$m; evaporating source boat: tantalum; RF power: 100 W; and DC bias: OV.

Films obtained by this embodiment were submitted to measurement of the film crystallization and film construction by means of X-ray diffraction and scanning electronic microscope. As the result, it was assured that films deposited at the same evaporating speed have the same quality.

As described above, since the present invention does not require a crystal oscillation monitoring method to detect and control the evaporating speed, detection is never prevented by film thickness and an immediate correlation of the detection result to evaporating speed control can be expected. Further, omission of expensive crystal monitoring equipment leads to cost reduction.

This invention is not restricted to deposition of ZnO film and is also effective for film deposition of other compounds i.e. $TiO_2$, $In_2O_3$, $Al_2O_3$, $SiO_2$, TiN, AlN, for example.

I claim:

1. In a process for depositing a film on a substrate by a vacuum deposition method, which comprises placing a substrate in a vacuum chamber, supplying reactive gas to the chamber, evacuating the chamber and setting a predetermined value of decrease in pressure therein, evaporating a metal in the chamber for reaction with the reactive gas whereby to deposit a film of the reaction product thereof on the substrate, the evaporation of said metal being effective to decrease the pressure in said vacuum chamber, the improvement which comprises: detecting the decrease in the pressure within said vacuum chamber caused by absorption of the reactive gas by the metal vapor, comparing the value of the detected decrease with said predetermined value to generate a detection signal in response to that decrease; and controlling the operation of said metal evaporating means in response to said detection signal to maintain said decrease at said predetermined value whereby to cause the rate at which the film is deposited on the substrate to remain substantially constant.

* * * * *